United States Patent
Ritter et al.

(10) Patent No.: US 9,923,383 B2
(45) Date of Patent: Mar. 20, 2018

(54) ADJUSTING FILTER IN A COUPLED COIL SYSTEM

(71) Applicant: Apple Inc., Cupertino, CA (US)

(72) Inventors: David W. Ritter, Cupertino, CA (US); Jeffrey M Alves, Cupertino, CA (US); Todd K. Moyer, Cupertino, CA (US); Steven G. Herbst, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 392 days.

(21) Appl. No.: 14/627,957

(22) Filed: Feb. 20, 2015

(65) Prior Publication Data

US 2015/0244179 A1    Aug. 27, 2015

Related U.S. Application Data

(60) Provisional application No. 61/943,479, filed on Feb. 23, 2014.

(51) Int. Cl.
| | |
|---|---|
| *H01F 27/42* | (2006.01) |
| *H02J 5/00* | (2016.01) |
| *H02J 7/02* | (2016.01) |
| *H02J 17/00* | (2006.01) |
| *H03H 7/40* | (2006.01) |

(52) U.S. Cl.
CPC ............ *H02J 5/005* (2013.01); *H02J 7/025* (2013.01); *H02J 17/00* (2013.01); *H03H 7/40* (2013.01)

(58) Field of Classification Search
CPC ....................................................... H02J 5/005
See application file for complete search history.

(56) References Cited

U.S. PATENT DOCUMENTS

| | | |
|---|---|---|
| 5,293,308 A | 3/1994 | Boys et al. |
| 5,639,989 A | 6/1997 | Higgins, III |
| 6,960,968 B2 | 11/2005 | Odenaal et al. |
| 6,972,543 B1 | 12/2005 | Wells |
| 7,641,358 B1 | 1/2010 | Smith et al. |

(Continued)

FOREIGN PATENT DOCUMENTS

| | | |
|---|---|---|
| CN | 101243374 | 8/2006 |
| CN | 101232190 | 7/2008 |

(Continued)

OTHER PUBLICATIONS

U.S. Appl. No. 15/179,922, filed Jun. 10, 2016, Lynch.

(Continued)

*Primary Examiner* — Daniel Puentes
(74) *Attorney, Agent, or Firm* — Brownstein Hyatt Farber Schreck, LLP (57) ABSTRACT

A receiver device in a coupled coil system for wireless energy transfer includes a receiver coil and a load device operatively connected to the receiver coil and configured to receive a signal from the receiver coil. As one example, the load device is a rechargeable battery. An adjusting filter is included in the receiver device and is operatively connected between the receiver coil and the load device. The adjusting filter can be used to transform the effective resistance or impedance of the load as presented to the transformer during energy transfer so that the effective resistant or impedance of the load is maintained at a substantially constant level, and the signal received by the load device is maintained at a substantially constant level.

19 Claims, 6 Drawing Sheets

(56) References Cited

U.S. PATENT DOCUMENTS

| | | |
|---|---|---|
| 7,948,208 B2 | 5/2011 | Partovi et al. |
| 7,952,322 B2 | 5/2011 | Partovi et al. |
| 8,024,491 B1 | 9/2011 | Wright et al. |
| 8,054,651 B2 | 11/2011 | Pollard |
| 8,169,151 B2 | 5/2012 | Kimura |
| 8,169,185 B2 | 5/2012 | Partovi et al. |
| 8,274,178 B2 | 9/2012 | Tucker |
| 8,278,784 B2 | 10/2012 | Cook |
| 8,362,744 B2 | 1/2013 | Terao et al. |
| 8,421,274 B2 | 4/2013 | Sun et al. |
| 8,629,652 B2 | 1/2014 | Partovi et al. |
| 8,629,654 B2 | 1/2014 | Partovi et al. |
| 8,663,106 B2 | 3/2014 | Stivoric |
| 8,810,071 B2 | 8/2014 | Sauerlaender et al. |
| 8,853,892 B2 | 10/2014 | Fells et al. |
| 8,884,469 B2 | 11/2014 | Lemmens |
| 8,890,470 B2 | 11/2014 | Partovi et al. |
| 8,896,264 B2 | 11/2014 | Partovi |
| 8,901,881 B2 | 12/2014 | Partovi et al. |
| 8,922,525 B2 | 12/2014 | Chen et al. |
| 8,947,047 B2 | 2/2015 | Partovi et al. |
| 9,018,904 B2 | 4/2015 | Seyerle et al. |
| 9,030,421 B2 | 5/2015 | Tseng et al. |
| 9,093,857 B2 | 7/2015 | Sakai et al. |
| 9,106,083 B2 | 8/2015 | Partovi |
| 9,112,362 B2 | 8/2015 | Partovi |
| 9,112,363 B2 | 8/2015 | Partovi |
| 9,112,364 B2 | 8/2015 | Partovi |
| 9,124,112 B2 | 9/2015 | Havass et al. |
| 9,126,490 B2 | 9/2015 | Cook |
| 9,154,189 B2 | 10/2015 | Von Novak et al. |
| 9,160,180 B2 | 10/2015 | Suzuki et al. |
| 9,178,369 B2 | 11/2015 | Partovi |
| 9,197,070 B2 | 11/2015 | Jung |
| 9,231,411 B2 | 1/2016 | Baarman et al. |
| 9,276,437 B2 | 3/2016 | Partovi et al. |
| 9,318,915 B2 | 4/2016 | Miller et al. |
| 9,352,661 B2 | 5/2016 | Keeling et al. |
| 9,356,659 B2 | 5/2016 | Partovi |
| 9,460,846 B2 | 10/2016 | Graham et al. |
| 9,461,502 B2 | 10/2016 | Lee |
| 9,496,731 B2 | 11/2016 | Park et al. |
| 9,515,514 B2 | 12/2016 | Lee et al. |
| 9,537,363 B2 | 1/2017 | Bossetti et al. |
| 9,768,643 B2 | 9/2017 | Kanno et al. |
| 9,813,041 B1 | 11/2017 | Ritter |
| 2001/0044588 A1 | 11/2001 | Mault |
| 2008/0284609 A1 | 11/2008 | Rofougaran |
| 2010/0328044 A1 | 12/2010 | Waffenschmidt et al. |
| 2011/0050164 A1 | 3/2011 | Partovi et al. |
| 2011/0198937 A1 | 8/2011 | Tseng |
| 2011/0221385 A1 | 9/2011 | Partovi |
| 2011/0234012 A1 | 9/2011 | Yi et al. |
| 2011/0241615 A1 | 10/2011 | Yeh |
| 2011/0254379 A1 | 10/2011 | Madawala |
| 2011/0302078 A1 | 12/2011 | Failing |
| 2012/0255039 A1 | 10/2012 | Sipes |
| 2012/0313577 A1 | 12/2012 | Moes et al. |
| 2013/0076648 A1 | 3/2013 | Krah et al. |
| 2013/0093388 A1 | 4/2013 | Partovi |
| 2013/0099563 A1 | 9/2013 | Partovi et al. |
| 2013/0257168 A1 | 10/2013 | Singh |
| 2013/0260677 A1 | 10/2013 | Partovi |
| 2013/0271069 A1 | 10/2013 | Partovi |
| 2013/0285604 A1 | 10/2013 | Partovi |
| 2013/0285605 A1 | 10/2013 | Partovi |
| 2013/0300204 A1 | 11/2013 | Partovi |
| 2013/0334326 A1 | 12/2013 | Shan |
| 2014/0015327 A1 | 1/2014 | Keeling et al. |
| 2014/0015522 A1 | 1/2014 | Widmer et al. |
| 2014/0035378 A1 | 2/2014 | Kesler et al. |
| 2014/0103873 A1 | 4/2014 | Partovi et al. |
| 2014/0129010 A1 | 5/2014 | Garg |
| 2014/0132210 A1 | 5/2014 | Partovi |
| 2014/0159656 A1 | 6/2014 | Riehl |
| 2014/0191568 A1 | 7/2014 | Partovi |
| 2014/0191818 A1 | 7/2014 | Waffenschmidt et al. |
| 2014/0197687 A1 | 7/2014 | Lin |
| 2014/0197782 A1 | 7/2014 | Graf et al. |
| 2014/0225439 A1 | 8/2014 | Mao |
| 2014/0266018 A1 | 9/2014 | Carobolante |
| 2014/0306654 A1 | 10/2014 | Partovi |
| 2015/0001950 A1 | 1/2015 | Chung et al. |
| 2015/0035372 A1* | 2/2015 | Aioanei ............... H02J 7/025 307/104 |
| 2015/0077045 A1 | 3/2015 | Harris |
| 2015/0280455 A1 | 3/2015 | Bosshard et al. |
| 2015/0130412 A1 | 5/2015 | Partovi |
| 2015/0207333 A1 | 7/2015 | Baarman et al. |
| 2015/0244179 A1 | 8/2015 | Ritter et al. |
| 2015/0244341 A1 | 8/2015 | Ritter et al. |
| 2015/0270058 A1 | 9/2015 | Golko et al. |
| 2015/0333530 A1 | 11/2015 | Moyer et al. |
| 2015/0349538 A1 | 12/2015 | Agostinelli et al. |
| 2016/0056664 A1 | 2/2016 | Partovi |
| 2016/0064948 A1 | 3/2016 | Heresztyn et al. |
| 2016/0064992 A1 | 3/2016 | Herbst et al. |
| 2016/0127672 A1 | 5/2016 | Kamide et al. |
| 2016/0172894 A1 | 6/2016 | Khripkov et al. |
| 2016/0181849 A1 | 6/2016 | Govindaraj |
| 2016/0261137 A1 | 9/2016 | Riehl |
| 2016/0285278 A1 | 9/2016 | Mehas et al. |
| 2017/0012463 A1 | 1/2017 | Lynch |
| 2017/0089959 A1 | 3/2017 | Ito et al. |
| 2017/0110911 A1 | 4/2017 | Bossetti et al. |

FOREIGN PATENT DOCUMENTS

| | | |
|---|---|---|
| CN | 101814757 | 8/2010 |
| CN | 202712982 | 1/2013 |
| CN | 103019485 | 4/2013 |
| CN | 202976038 | 6/2013 |
| CN | 103324333 | 9/2013 |
| CN | 103326475 | 9/2013 |
| CN | 103518175 | 1/2014 |
| CN | 103545893 | 1/2014 |
| CN | 103597711 | 2/2014 |
| CN | 103765722 | 4/2014 |
| CN | 103812162 | 5/2014 |
| CN | 103999320 | 8/2014 |
| EP | 2642628 | 9/2013 |
| GB | 2484999 | 5/2012 |
| JP | H08149608 | 6/1996 |
| JP | 2001069388 | 3/2001 |
| JP | 2001333551 | 11/2001 |
| JP | 2010161882 | 7/2010 |
| JP | 2010268531 | 11/2010 |
| JP | 2011120443 | 6/2011 |
| JP | 2011259612 | 12/2011 |
| JP | 2012503959 | 2/2012 |
| JP | 2013115929 | 6/2013 |
| JP | 2014193087 | 10/2014 |
| WO | WO 10/108191 | 9/2010 |
| WO | WO 12/085119 | 6/2012 |
| WO | WO 13/122625 | 8/2013 |
| WO | WO 16/024869 | 2/2016 |

OTHER PUBLICATIONS

International Search Report and Invitation to Pay Additional Fees dated Apr. 22, 2015, PCT/US2015/016689, 6 pages.
International Search Report and Written Opinion dated Jun. 30, 2015, PCT/US2015/016689, 16 pages.

\* cited by examiner

ABSTRACT# ADJUSTING FILTER IN A COUPLED COIL SYSTEM

CROSS-REFERENCE TO RELATED APPLICATION

This application claims the benefit under 35 U.S.C. § 119(e) of U.S. Provisional Patent Application No. 61/943,479, filed on Feb. 23, 2014, and entitled "Adjusting Filter in a Coupled Coil System," which is incorporated by reference as if fully disclosed herein.

TECHNICAL FIELD

The present invention relates to coupled coil systems for wireless energy transfer, and more particularly to an adjusting filter in a coupled coil system.

BACKGROUND

Wireless energy transfer is typically used to operate an electronic device or to charge a battery. For example, a rechargeable battery in an electronic device can be recharged through inductive charging by coupling a transmitter coil in a charging device with a receiver coil in the electronic device. When a signal is applied to the transmitter coil, an electromagnetic field is created and transfers energy to the receiver coil. The receiver coil converts the energy into a signal that is used to charge the battery. But resistive heat and other signal losses are generated as well when the signals pass through transmitter and receiver coils. These resistive heat and signal losses can vary depending on the operating conditions of the coupled coil system, and in some instances can reduce the efficiency of the energy transfer between the charging station and the electronic device.

SUMMARY

During wireless energy transfer, an effective resistance or impedance of a load of a receiver device can be transformed using one or more techniques described herein so that the effective resistance or impedance of the load, as presented to the transformer, is substantially constant and the signal received by a load device is maintained at a substantially constant level. The term "load" can refer to the receiver device as presented to the transformer. In one aspect, a coupled coil system for wireless energy transfer can include a receiver device that has a load device operatively connected to a receiver coil and configured to receive a signal produced by the receiver coil. In one embodiment, the load device is a rechargeable battery in an electronic device. An adjusting filter in the receiver device is operatively connected between the receiver coil and the load device. During energy transfer, the adjusting filter may adjust a signal that the load device receives from the receiver coil to adjust the effective resistance or impedance of the load. In some embodiments, the adjusting filter can increase the signal to reduce the effective resistance or impedance of the load that is presented to the transformer. In other embodiments, the adjusting filter can decrease the signal to transform the effective resistance or impedance of the load up. A rectifier can be connected between the adjusting filter and the load device. As one example, the rectifier can be implemented with four diodes arranged in a bridge circuit. The term "adjusting filter" is intended to encompass a filter that adjusts an effective resistance or impedance of a load in the receiver device.

In one embodiment, the adjusting filter is a linear adjusting filter. For example, the linear adjusting filter may include a first capacitor connected in series with the receiver coil and a second capacitor connected in parallel with the receiver coil. In another embodiment, the adjusting filter is a non-linear adjusting filter. As one example, the non-linear adjusting filter can include a first capacitor connected in series with the receiver coil and a second capacitor connected in parallel with a grounded diode in the bridge circuit (i.e., the rectifier). And in yet another embodiment, the adjusting filter is a programmable adjusting filter. For example, the programmable adjusting filter may include a first variable capacitor connected in series with the receiver coil and a second variable capacitor connected in parallel with the receiver coil. Alternatively, the programmable adjusting filter may include a first variable capacitor connected in series with the receiver coil and a second variable capacitor connected in parallel with a grounded diode in the rectifier. And in another embodiment, the programmable adjusting filter can include one variable capacitor and a fixed capacitor, where one of the capacitors is connected in series with the receiver coil and the other capacitor is connected in parallel with either the receiver coil or a grounded diode in the rectifier.

In another aspect, a method for wirelessly transferring energy from a transmitter coil in a transmitter device to a receiver coil in a receiver device can include determining one or more operating parameters of a load device in the receiver device and determining a frequency of a signal applied to the transmitter coil in the transmitter device. A capacitance value for at least one variable capacitor in a programmable adjusting filter operatively connected to the receiver coil is determined based on the one or more operating parameters of the load device and the frequency of the signal. A current or a voltage of the load device is an example of an operating parameter.

In another aspect, a method for wirelessly transferring energy from a transmitter coil in a transmitter device to a receiver coil in a receiver device can include transferring energy to the receiver coil by applying a signal to the transmitter coil when a load device operatively connected to the receiver coil is in an operating mode. For example, the load device can be in a charging mode when the load device is a rechargeable battery. A signal received from the receiver coil can be adjusted (e.g., increased or decreased), and the adjusted signal input into the load device. A frequency of the signal applied to the transmitter coil may be changed based on a change in the operating mode of the load device.

And in yet another aspect, a method for wirelessly transferring energy from a transmitter coil in a transmitter device to a receiver coil in a receiver device can include determining one or more operating parameters of a load device included in the receiver device and determining a frequency of a signal applied to the transmitter coil in the transmitter device. A load current or a load voltage of the load device is an example of an operating parameter. A value for at least one variable component in a programmable adjusting filter operatively connected to the receiver coil may be set based on the one or more operating parameters of the load device and the frequency of the signal. As one example, the at least one variable component in the programmable adjusting filter can be one or more variable capacitors.

BRIEF DESCRIPTION OF THE DRAWINGS

Embodiments of the invention are better understood with reference to the following drawings. The elements of the drawings are not necessarily to scale relative to each other. Identical reference numerals have been used, where possible, to designate identical features that are common to the figures.

DETAILED DESCRIPTION

Embodiments described herein can transfer energy wirelessly from a transmitter coil to a receiver coil more efficiently by adjusting the effective resistance or impedance of a load in the receiver device (as presented to the transformer) so that the effective resistance or impedance is maintained at a substantially constant level. As described earlier, the term "load" refers to the receiver device as presented to the transformer. The load should appear to the transformer as a fixed resistive value while the signal (e.g., voltage) that is received by a load device operatively connected to the receiver coil is maintained at a constant level.

Energy can be transferred from a transmitter coil to a receiver coil by applying a signal to the transmitter coil. A signal received from the receiver coil can be adjusted by an adjusting filter in the receiver device. The adjusting filter can be used to transform the effective resistance or impedance of the load as presented to the transformer. For example, the adjusting filter can transform the effective resistance or impedance of the load upwards, allowing the signal that is applied to the transmitter coil to be reduced while simultaneously maintaining the input signal to the load at a substantially constant level. Additionally or alternatively, the adjusting filter can transform the effective resistance or impedance of the load downward when the signal applied to the transmitter coil is increased, thereby permitting the signal that is received by the load to be maintained at a substantially constant level. As noted earlier, the term "adjusting filter" is intended to encompass a filter that transforms or adjusts the effective resistance or impedance of the load.

In some embodiments, in addition to the transformation of the effective resistance or impedance of the load by the adjusting filter, a frequency of the signal applied to the transmitter coil can be shifted or changed based on a change in one or more operating parameters of the load. As one example, when the load device is a rechargeable battery and the battery is charged completely, the current drawn by the battery can lower. In this example, maintaining the frequency of the transmitter coil signal can produce unnecessary losses since the frequency of the transmitter coil may be higher than what is needed by the battery. Changing the frequency of the transmitter coil signal (e.g., reducing the frequency) can reduce resistive heat and other losses produced by the changing operating condition or parameter of the battery. Thus, the efficiency of the energy transfer can be maintained regardless of any changes in the operating parameters of the load device.

In some embodiments, a signal characteristic in the transmitter device and/or in the receiver device can be monitored to determine the effective resistance or impedance of the load. In one example, a processing device can monitor the current received by an electrical component (e.g., a resistor) in the transmitter device to determine whether the frequency of the transmitter coil signal can be adjusted. In another example, a processing device in the receiver device can monitor the current received by a component (e.g., a resistor or a battery) in the receiver device to determine whether the adjusting filter should increase or decrease the signal level that is received by the load device (e.g., the battery). Other embodiments can determine the operation of the adjusting filter and/or the adjustment of the transmitter coil signal frequency differently.

As noted earlier, embodiments can perform a type of impedance or resistance transformation so that an effective impedance or resistance of the load can remain approximately constant regardless of the actual load. Essentially, the load in the receiver device may appear as a substantially fixed resistive value and the signal on the transmitter coil can be changed based on changes in one or more operating parameters of the load device. For example, if an operating parameter is lower than it previously was (e.g., a lower current), the signal on the transmitter coil can be reduced and the adjusting filter in the receiver device can increase the reduced signal so that the effective resistance or impedance of the load is substantially constant and the signal received by the load device is maintained at a substantially constant level.

Embodiments are described herein as using the adjusting filter to increase the signal (e.g., voltage) received by the load device to reduce the effective resistance or impedance of the load. But as discussed earlier, in other embodiments the adjusting filter can transform the effective resistance or impedance of the load upwards so that the effective resistance or impedance as presented to the transformer is higher. That is, in some embodiments, the adjusting filter can reduce the voltage across the load device and effectively increase the load resistance or impedance presented to the receiver coil.

Figure 1:
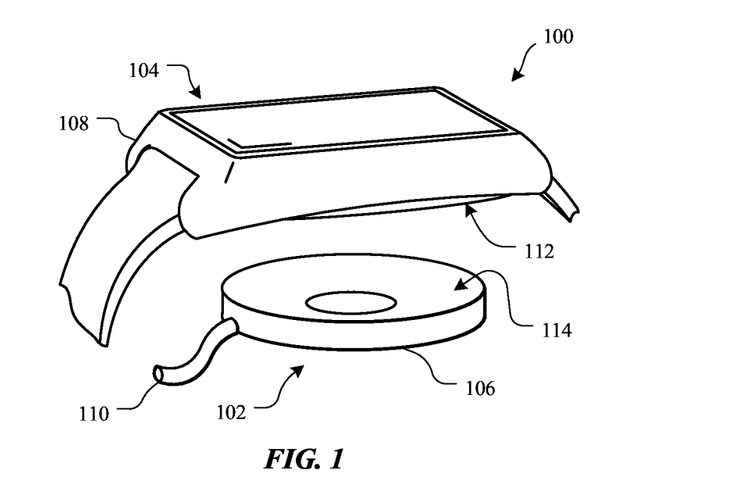
FIG. 1 illustrates one example of a wireless energy transfer system in an unmated configuration.

Referring now to FIG. 1, there is shown a perspective view of one example of a wireless energy transfer system in an unmated configuration. The illustrated embodiment depicts a transmitter device 102 that is configured to wirelessly transfer energy to a receiver device 104. The receiver device 104 can be any electronic device that includes one or more inductors. Example electronic devices include, but are not limited to, a portable electronic device or a wearable communication device.

The wearable communication device, such as the one depicted in FIG. 1, may be configured to provide, for example, wireless electronic communication from other devices and/or health-related information or data such as but not limited heart rate data, blood pressure data, temperature data, oxygen level data, diet/nutrition information, medical reminders, health-related tips or information, or other health-related data. The wearable communication device may include a coupling mechanism to connect a strap or band to a user. For example, a smart watch may include a band or strap to secure to a user's wrist. In another example, a wearable health assistant may include a strap to connect around a user's chest, or alternately, a wearable health assistant may be adapted for use with a lanyard or necklace. In still further examples, a wearable device may secure to or within another part of a user's body. In these and other embodiments, the strap, band, lanyard, or other securing mechanism may include one or more electronic components or sensors in wireless or wired communication with the communication device. For example, the band secured to a smart watch may include one or more sensors, an auxiliary battery, a camera, or any other suitable electronic component.

In many examples, a wearable communication device, such as the one depicted in FIG. 1, may include a processing device coupled with, or in communication with a memory, one or more communication interfaces, output devices such as displays and speakers, one or more sensors, such as biometric and imaging sensors, and input devices such as one or more buttons, one or more dials, a microphone, and/or a touch sensing device. The communication interface(s) can provide electronic communications between the communications device and any external communication network, device or platform, such as but not limited to wireless interfaces, Bluetooth interfaces, Near Field Communication interfaces, infrared interfaces, USB interfaces, Wi-Fi interfaces, TCP/IP interfaces, network communications interfaces, or any conventional communication interfaces. The wearable communication device may provide information regarding time, health, statuses or externally connected or communicating devices and/or software executing on such devices, messages, video, operating commands, and so forth (and may receive any of the foregoing from an external device), in addition to communications.

Figure 2:
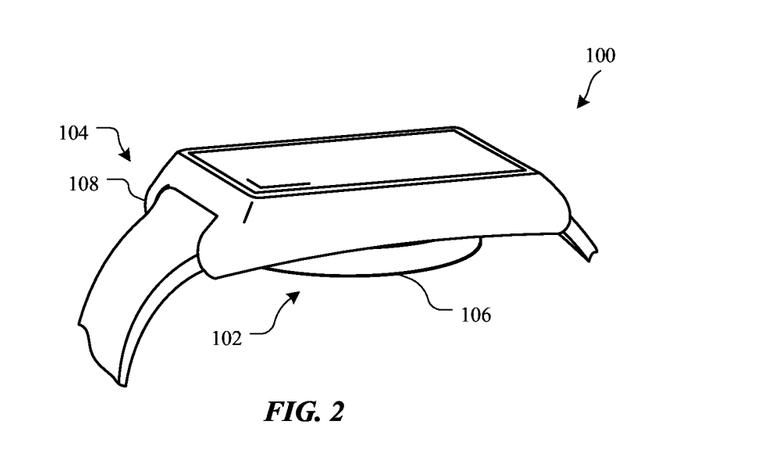
FIG. 2 depicts the wireless energy transfer system 100 in a mated configuration.

Although the wearable communication device illustrated in FIGS. 1 and 2 depicts a wristwatch or smart watch, any electronic device may be suitable to receive energy wirelessly from a transmitter device. For example, a suitable electronic device may be any portable or semi-portable electronic device that may receive energy wirelessly ("receiver device"), and a suitable dock device may be any portable or semi-portable docking station or charging device that may transmit energy wirelessly ("transmitter device"). Example electronic devices include, but are not limited to, a smart telephone, a gaming device, a digital music player, a tablet computing device, and other types of portable and consumer electronic devices that are configured to transmit and/or receive energy wirelessly.

The transmitter device 102 and the receiver device 104 may each respectively include a housing 106, 108 to enclose electronic, mechanical and structural components therein. In many examples, and as depicted, the receiver device 104 may have a larger lateral cross section than that of the transmitter device 102, although such a configuration is not required. In other examples, the transmitter device 102 may have a larger lateral cross section than that of the receiver device 104. In still further examples, the cross sections may be substantially the same. And in other embodiments, the transmitter device can be adapted to be inserted into a charging port in the receiver device.

In the illustrated embodiment, the transmitter device 102 may be connected to a power source by cord or connector 110. For example, the transmitter device 102 can receive power from a wall outlet, or from another electronic device through a connector, such as a USB connector. Additionally or alternatively, the transmitter device 102 may be battery operated. Similarly, although the illustrated embodiment is shown with the connector 110 coupled to the housing of the transmitter device 102, the connector 110 may be connected by any suitable means. For example, the connector 110 may be removable and may include a connector that is sized to fit within an aperture or receptacle opened within the housing 106 of the transmitter device 102.

The receiver device 104 may include a first interface surface 112 that may interface with, align or otherwise contact a second interface surface 114 of the transmitter device 102. In this manner, the receiver device 104 and the transmitter device 102 may be positionable with respect to each other. In certain embodiments, the second interface surface 114 of the transmitter device 102 may be configured in a particular shape that mates with a complementary shape of the receiver device 104 (see FIG. 2). The illustrative second interface surface 114 may include a concave shape that follows a selected curve. The first interface surface 112 of the receiver device 104 may include a convex shape following the same or substantially similar curve as the second interface surface 114.

In other embodiments, the first and second interface surfaces 112, 114 can have any given shape and dimension. For example, the first and second interface surfaces 112, 114 may be substantially flat. Additionally or alternatively, the transmitter and receiver devices 102, 104 can be positioned with respect to each other using one or more alignment mechanisms. As one example, one or more magnetic devices may be included in the transmitter and/or receiver devices and used to align the transmitter and receiver devices. In another example, one or more actuators in the transmitter and/or receiver devices can be used to align the transmitter and receiver devices. And in yet another example, alignment features, such as protrusions and corresponding indentations in the housings of the transmitter and receiver devices, may be used to align the transmitter and receiver devices. The design or configuration of the interface surfaces, one or more alignment mechanisms, and one or more alignment features can be used individually or in various combinations thereof.

Figure 3:
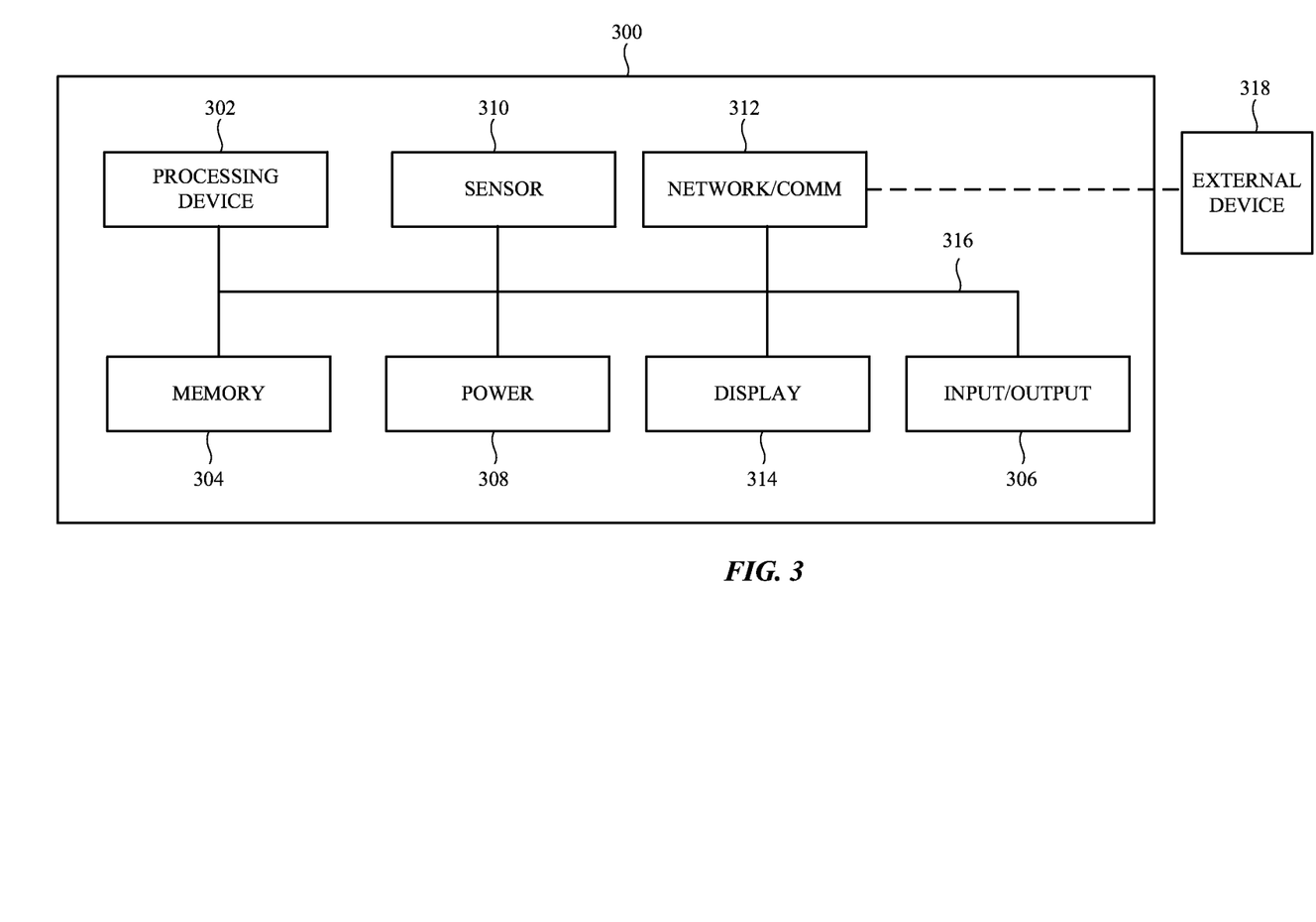
FIG. 3 depicts a simplified block diagram of one example of the wireless energy transfer system 100 shown in FIG. 1.

The transmitter device and the receiver device can each include a number of internal components. FIG. 3 is a simplified block diagram of an example electronic device that is suitable for use as a receiver device or as a transmitter device. The electronic device 300 can include one or more processing devices 302, memory 304, one or more input/output (I/O) devices 306, a power source 308, one or more sensors 310, a network/communication interface 312, and a display 314, each of which will be discussed in turn below.

The one or more processing devices 302 can control some or all of the operations of the electronic device 300. The processing device(s) 302 can communicate, either directly or indirectly, with substantially all of the components of the device. For example, one or more system buses 316 or other communication mechanisms can provide communication between the processing device(s) 302, the memory 304, the one or more I/O devices 306, the power source 308, the one or more sensors 310, the network/communication interface 312, and the display 314. At least one processing device can be configured to determine if the operation of one or more devices or functions in the electronic device 300 is to be adjusted based on environmental data, such as temperature. Additionally or alternatively, the processing device may be configured to adjust the operation (e.g., adjust a stimulus that is received by a device performing the operation) based on the environmental data.

The processing device(s) 302 can be implemented as any electronic device capable of processing, receiving, or transmitting data or instructions. For example, the one or more processing devices 302 can be a microprocessor, a central processing unit (CPU), an application-specific integrated circuit (ASIC), a digital signal processor (DSP), or combinations of multiple such devices. As described herein, the term "processing device" is meant to encompass a single processor or processing unit, multiple processors, multiple processing units, or other suitably configured computing element or elements.

The memory 304 can store electronic data that can be used by the electronic device 300. For example, the memory 304 can store electrical data or content such as audio files, document files, timing and control signals, operational settings and data, and image data. The memory 304 can be configured as any type of memory. By way of example only, memory 304 can be implemented as random access memory, read-only memory, Flash memory, removable memory, or other types of storage elements, in any combination.

The one or more I/O devices 306 can transmit and/or receive data to and from a user or another electronic device. Example I/O device(s) 306 include, but are not limited to, a touch sensing input device such as a touchscreen or track pad, one or more buttons, a microphone, and/or a speaker.

The power source 308 can be implemented with any device capable of providing energy to the electronic device 300. For example, the power source 308 can be one or more batteries or rechargeable batteries, or a connection cable that connects the electronic device to another power source such as a wall outlet.

The electronic device 300 may also include one or more sensors 310 positioned substantially anywhere on or in the electronic device 300. The sensor or sensors 310 may be configured to sense substantially any type of characteristic, such as but not limited to, images, pressure, light, heat, touch, force, temperature, humidity, movement, relative motion, biometric data, and so on. For example, the sensor(s) 310 may be an image sensor, a temperature sensor, a light or optical sensor, an accelerometer, an environmental sensor, a gyroscope, a magnet, a health monitoring sensor, and so on.

The network communication interface 312 can facilitate transmission of data to or from other electronic devices. For example, a network communication interface can transmit electronic signals via a wireless and/or wired network connection. For example, in one embodiment a communication signal is transmitted to a transmitter device and/or to a receiver device to permit the transmitter and receiver devices to communicate with one another. Examples of wireless and wired network connections include, but are not limited to, cellular, Wi-Fi, Bluetooth, IR, Ethernet, and Near Field Communication (NFC).

In some embodiments, an external device 318 can transmit signals to the electronic device 300 for data storage, data or signal processing, and/or to manage one or more operations of the electronic device 300 (e.g., adjust the frequency of the signal applied to a transmitter coil) to be modified. Similarly, the electronic device 300 can transmit signals to the external device 318 for data storage, data or signal processing, and/or to manage the operations of one or more devices in the external device 318. In some embodiments, the signals are transmitted between the network communication interface 312 in the electronic device and a network communication interface (not shown) in the external device 318. A processing device in the external device 318 can be configured to store and/or process data or signals or to determine if the operation of one or more devices in the external device is to be adjusted.

The display 314 can provide a visual output to the user. The display 314 can be implemented with any suitable technology, including, but not limited to, a multi-touch sensing touchscreen that uses liquid crystal display (LCD) technology, light emitting diode (LED) technology, organic light-emitting display (OLED) technology, organic electroluminescence (OEL) technology, or another type of display technology. In some embodiments, the display 314 can function as an input device that allows the user to interact with the electronic device 300. For example, the display can be a multi-touch touchscreen display.

It should be noted that FIG. 3 is exemplary only. In other examples, the electronic device may include fewer or more components than those shown in FIG. 3. Additionally or alternatively, the electronic device can be included in a system and one or more components shown in FIG. 3 is separate from the electronic device but in communication with the electronic device. For example, an electronic device may be operatively connected to, or in communication with a separate display. As another example, one or more applications or data can be stored in a memory separate from the electronic device. As another example, a processing device in communication with the electronic device can control various functions in the electronic device and/or process data received from the electronic device. In some embodiments, the separate memory and/or processing device can be in a cloud-based system or in an associated device.

The embodiments shown in FIGS. 4-9 are described in conjunction with an adjusting filter boosting or increasing the signal received by the load device. The adjusting filter can transform the effective resistance or impedance downward by increasing the signal to the load device. But as described earlier, an adjusting filter can also decrease the signal that is received by the load device to increase the effective resistance or impedance of the load.

Figure 4:
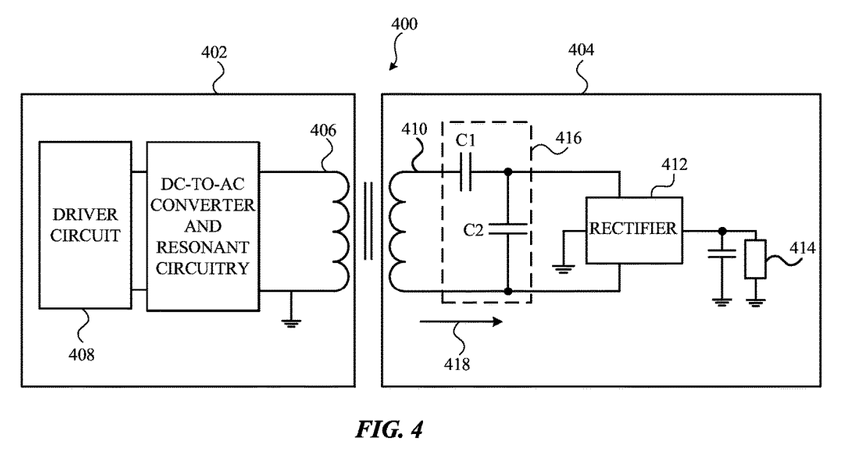
FIG. 4 is a simplified schematic diagram of a first wireless energy transfer system.

Referring now to FIG. 4, there is shown a simplified schematic diagram of a first wireless energy transfer system. The wireless energy transfer system 400 includes a transmitter device 402 and a receiver device 404. The transmitter device 402 can be a charging device or an electronic device that includes a charging device. The receiver device 404 can be any suitable electronic device, such as a wearable communication device, a wearable health assistant, a smart telephone, a media player, or any other portable electronic device.

The transmitter device 402 can include a transmitter coil 406 operatively connected to a driver circuit 408. The receiver device 404 may include a receiver coil 410 operatively connected to a rectifier 412. Any suitable rectifier can be used. As one example, the rectifier 412 can include four diodes arranged in a bridge circuit.

The rectifier 412 may be operatively connected to a load device 414. As one example, the load device can be a rechargeable battery in a portable electronic device. An adjusting filter 416 may be connected to the receiver coil 410 and to the rectifier 412. In the illustrated embodiment, the adjusting filter 416 is a linear adjusting filter that includes a first capacitor C1 connected in series with the receiver coil 410 and a second capacitor C2 connected in parallel with the receiver coil 410.

When energy is to be transferred wirelessly from the transmitter device 402 to the receiver device 404, the driver circuit 408 applies a signal to the transmitter coil 406 and the transmitter coil 406 generates an electromagnetic field that electrically couples the transmitter coil 406 and the receiver coil 410 together. The receiver coil 410 responsively produces a signal and the adjusting filter 416 boosts or increases the signal. The rectifier 412 converts the increased signal from an increased alternating current (AC) signal to an increased direct current (DC) signal. The increased DC signal is received by the load device 414.

The adjusting filter 416 can improve the efficiency of the energy transfer by allowing the transmitter coil signal level that is required to supply a given voltage to the load device 414 to vary. A lower signal level can be applied to the transmitter coil since the adjusting filter 416 boosts or increases the signal that is produced by the receiver coil 410 so that a substantially constant input signal (e.g., voltage) is input into to the load device. The increased signal can reduce the effective resistance or impedance of the load (as looking in the direction of the arrow 418) because an increased signal is produced with the same voltage that is received by the receiver coil 410.

Additionally, one or more of the operating parameters of the load device 414 may vary over time. For example, when the load device is a rechargeable battery, the current can decrease when the battery is charged completely. In some embodiments, the frequency of the signal applied to the transmitter coil 406 can be shifted or changed to compensate for the changing operating parameter of the load device. The effective resistance or impedance of the load may be maintained at a substantially constant level by changing the frequency of the transmitter coil signal.

In some embodiments, the adjusting filter 416 in FIG. 4 can produce relatively large circulating currents that may lead to losses in the receiver coil 410. For example, the circulating currents may produce heat in the receiver coil 410. At some point in time, the heat loss can exceed the increased signal produced by the adjusting filter, which reduces the efficiency of the energy transfer. The adjusting filter shown in FIG. 5 may not produce large circulating currents.

Figure 5:
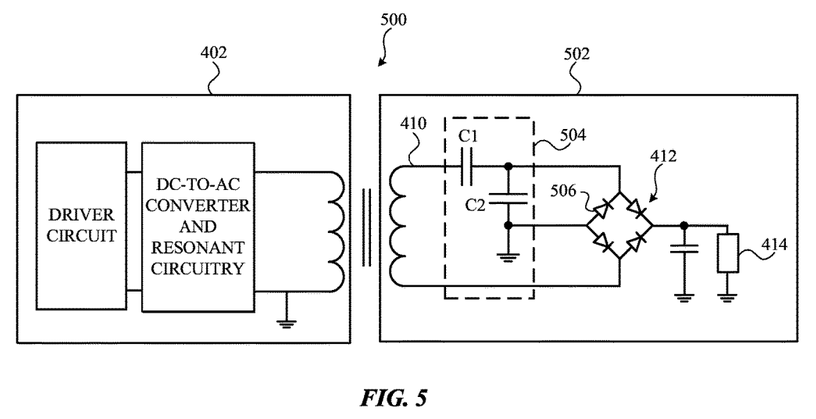
FIG. 5 is a simplified schematic diagram of a second wireless energy transfer system.

FIG. 5 is a simplified schematic diagram of a second wireless energy transfer system. The wireless energy transfer system 500 includes the transmitter device 402 and a receiver device 502. In the illustrated embodiment, the rectifier 412 is implemented with four diodes arranged in a bridge circuit, and the adjusting filter is a non-linear adjusting filter that includes a first capacitor C1 connected in series with the receiver coil 410 and a second capacitor C2 connected in parallel with the a grounded diode 506 in the rectifier 412. The signal produced by the rectifier 412 is asymmetrical in that for half of the cycle the boosted or increased signal is received by the load device 414. As previously described, the adjusting filter 504 in FIG. 5 does not produce large circulating currents. The net effect is that a boosted or increased signal produced by the non-linear adjusting filter 504 improves the efficiency of the energy transfer without resulting in losses that are produced by circulating currents.

Figure 6:
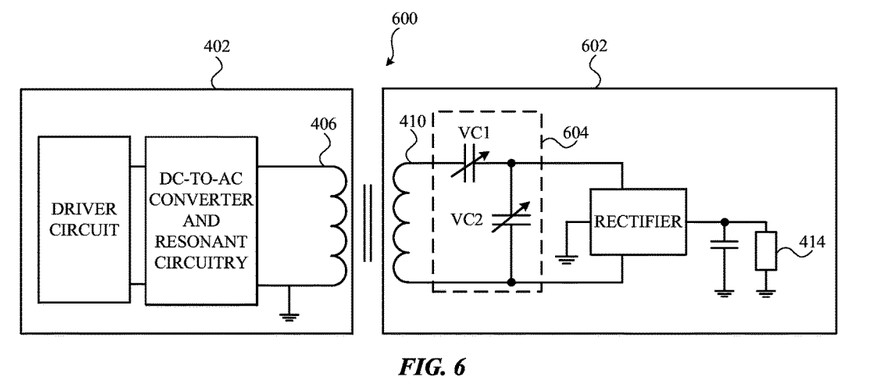
FIG. 6 is a simplified schematic diagram of a third wireless energy transfer system.

Referring now to FIG. 6, there is shown a simplified schematic diagram of a third wireless energy transfer system. The wireless energy transfer system 600 includes the transmitter device 402 and a receiver device 602. In the illustrated embodiment, a programmable adjusting filter 604 includes a first variable capacitor VC1 connected in series with the receiver coil 410 and a second variable capacitor VC2 connected in parallel with the receiver coil 410. The capacitance values of the variable capacitors VC1 and VC2 can be set to optimize the efficiency of the energy transfer between the transmitter device 402 and receiver device 502. In some embodiments, the capacitance values of the variable capacitors VC1 and VC2 are determined based on one or more operating parameters of the load device 414 (e.g., a given current and/or a given voltage) and a given frequency of the signal applied to the transmitter coil 406.

In one embodiment, the programmable adjusting filter 604 can be implemented in an application-specific integrated circuit that includes switches connected to multiple capacitors. The switches can be opened and closed to adaptively change the capacitance values of the variable capacitors VC1 and VC2 based on a change in the one or more operating parameters of the load device and/or the frequency of the transmitter coil signal. As described earlier, a current or a voltage is an example of an operating parameter of the load device.

Figure 7:
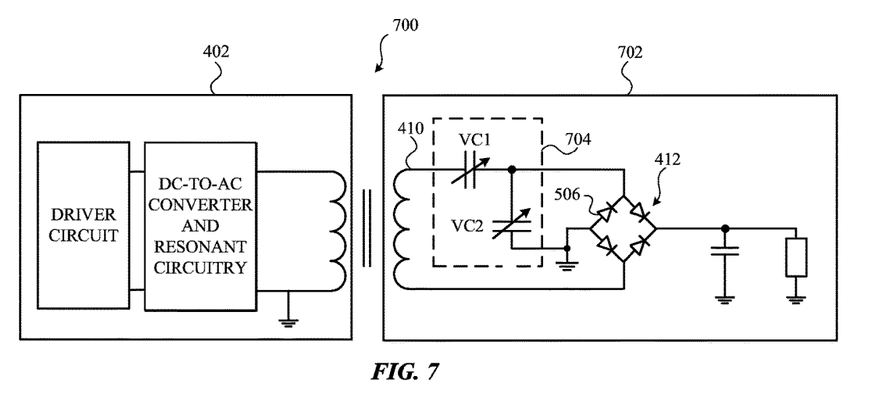
FIG. 7 is a simplified schematic diagram of a fourth wireless energy transfer system.

In another embodiment shown in FIG. 7, the programmable adjusting filter 704 can include a first variable capacitor VC1 connected in series with the receiver coil 410 and a second variable capacitor VC2 connected in parallel with a grounded diode 506 in the rectifier 412. The illustrated embodiment can obtain a similar resistance-adjusting effect as the embodiment shown in FIG. 5 without generating substantial circulating currents.

The adjusting filters shown in FIGS. 4 and 5 are each implemented with two capacitors while the programmable adjusting filters in FIGS. 6 and 7 are implemented with two variable capacitors. Other embodiments can implement an adjusting filter or a programmable adjusting filter with a different number of capacitors or variable capacitors. Additionally or alternatively, other embodiments can construct an adjusting filter or a programmable adjusting filter with different components. Additionally or alternatively, a programmable adjusting filter can include one or more components that have fixed values and one or more adjustable components that have adjustable values. For example, the programmable adjusting filter can include one variable capacitor and a fixed capacitor, where one of the capacitors is connected in series with the receiver coil and the other capacitor is connected in parallel with either the receiver coil or a grounded diode in the rectifier.

Figure 8:
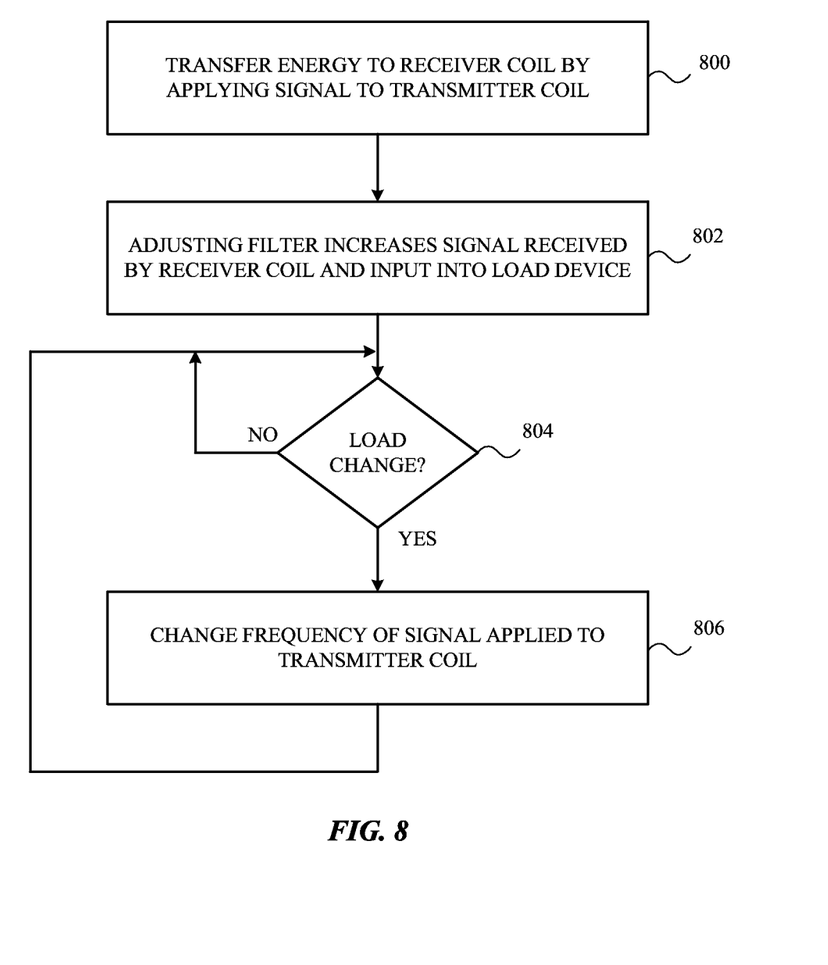
FIG. 8 is a flowchart of an example method for wirelessly transferring energy from a transmitter device to a receiver device in the wireless energy transfer system 100 shown in FIG. 1.

Referring now to FIG. 8, there is shown a flowchart of an example method for wirelessly transferring energy from a transmitter device to a receiver device in the wireless energy transfer system 400 shown in FIG. 4. Initially, as shown in block 800, energy is transferred from the transmitter device to the receiver device by applying a signal to the transmitter coil. An adjusting filter can then boost or increase the signal received from the receiver coil, and the load device may receive the increased signal (block 802). The adjusting filter can be a linear adjusting filter, a non-linear adjusting filter, or a programmable adjusting filter.

Next, as shown in block 804, a determination is made as to whether or not one or more operating parameters of the load device has changed (e.g., current decreases). If not, the method can wait at block 804. If one or more operating parameters of the load device has changed, the process passes to block 806 where the frequency of the signal applied to the transmitter coil is shifted or changed based on the change in the operating parameter of the load device. Changing the frequency of the transmitter coil signal can maintain the energy transfer efficiency at a desired or optimum level.

Figure 9:
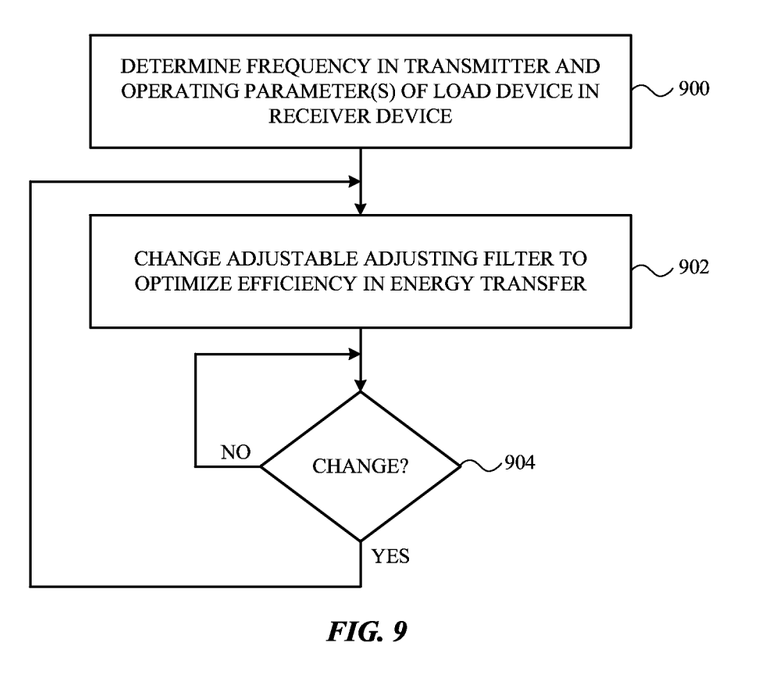
FIG. 9 is a flowchart of an example method for wirelessly transferring energy from a transmitter device to a receiver device in the wireless energy transfer system 600 and 700 shown in FIGS. 6 and 7, respectively.

FIG. 9 is a flowchart of an example method for wirelessly transferring energy from a transmitter device to a receiver device in the wireless energy transfer systems 600 and 700 shown in FIGS. 6 and 7, respectively. Initially, as shown in block 900, the frequency of the signal applied to the transmitter coil and one or more operating parameters of the load device in the receiver device are determined. A capacitance value for one or more variable capacitors in a programmable adjusting filter is then changed to determine or to maintain the energy transfer efficiency at a desired or optimum level (block 902).

A determination can be made at block 904 as to whether or not the frequency of the signal applied to the transmitter coil and/or one or more operating parameters of the load device in the receiver device have changed (e.g., if a load current or voltage has changed). If not, the method may wait at block 904. If the frequency of the signal applied to the transmitter coil and/or one or more operating parameters of the load device in the receiver device have changed, the process returns to block 902 where the capacitance value for one or more variable capacitors in the programmable adjusting filter is changed to maintain the energy transfer efficiency at a desired or optimum level.

Various embodiments have been described in detail with particular reference to certain features thereof, but it will be understood that variations and modifications can be effected within the spirit and scope of the disclosure. And even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

We claim:

1. A coupled coil system for wireless power transfer between a transmitter and a receiver, comprising:
   a receiver coil in the receiver;
   a load in the receiver operatively connected to the receiver coil; and
   an adjusting filter in the receiver operatively connected between the receiver coil and the load, wherein the adjusting filter changes a signal received from the receiver coil to adjust an effective resistance or impedance of the load, the adjusting filter comprising:
      a first variable capacitor in series with the receiver coil; and
      a second variable capacitor connected parallel to the receiver coil.

2. The coupled coil system as in claim 1, further comprising a rectifier operatively connected between the adjusting filter and the load.

3. The coupled coil system as in claim 1, wherein the adjusting filter comprises a linear adjusting filter.

4. The coupled coil system as in claim 1, wherein the adjusting filter comprises a non-linear adjusting filter.

5. The coupled coil system as in claim 1, wherein the non-linear adjusting filter comprises:
   a first capacitor connected in series to the receiver coil; and
   a second capacitor connected in parallel a grounded diode in the rectifier.

6. The coupled coil system as in claim 1, wherein the load comprises a rechargeable battery.

7. The coupled coil system as in claim 1, wherein the adjusting filter comprises a programmable adjusting filter.

8. The coupled coil system as in claim 7, wherein the programmable adjusting filter comprises a first variable capacitor connected in series with the receiver coil and a second variable capacitor connected in parallel with the receiver coil.

9. A method for wirelessly transferring power from a transmitter coil in a transmitter to a receiver coil in a receiver, the method comprising:
   determining one or more operating parameters of a load included in the receiver;
   determining a frequency of a signal applied to the transmitter coil in the transmitter; and
   setting a capacitance value for at least one variable capacitor in a programmable adjusting filter parallel to the receiver coil based on the one or more operating parameters of the load and the frequency of the signal.

10. The method as in claim 9, wherein the one or more operating parameters comprises a load current.

11. The method as in claim 9, wherein the one or more operating parameters comprises a load voltage.

12. The method as in claim 9, wherein setting a capacitance value for at least one variable capacitor in a programmable adjusting filter operatively connected to the receiver coil comprises setting a first capacitance value for a first variable capacitor connected in series with the receiver coil and setting a second capacitance value for a second variable capacitor connected in parallel with the receiver coil.

13. The method as in claim 9, wherein the transmitter comprises a charging device.

14. The method as in claim 9, wherein the receiver comprises a portable electronic device.

15. A method for wirelessly transferring power from a transmitter coil in a transmitter to a receiver coil in a receiver, the method comprising:
   transferring power to the receiver coil by applying a signal to the transmitter coil when a load operatively connected to the receiver coil is in an operating mode;
   adjusting a signal received from the receiver coil by modifying a capacitance parallel to the receiver coil;
   inputting the adjusted signal into the load; and
   shifting a frequency of the signal applied to the transmitter coil based on a change in the operating mode of the load.

16. The method as in claim 15, wherein the transmitter comprises a charging device.

17. The method as in claim 15, wherein the receiver comprises a portable electronic device.

18. The method as in claim 15, wherein adjusting a signal received from the receiver coil comprises increasing a signal received from the receiver coil.

19. The method as in claim 15, wherein adjusting a signal received from the receiver coil comprises decreasing a signal received from the receiver coil.

* * * * *